(12) United States Patent
Ueyama

(10) Patent No.: US 10,274,535 B2
(45) Date of Patent: Apr. 30, 2019

(54) ELECTRIC COMPONENT SOCKET

(71) Applicant: ENPLAS CORPORATION, Kawaguchi-shi, Saitama (JP)

(72) Inventor: Yuki Ueyama, Kawaguchi (JP)

(73) Assignee: ENPLAS CORPORATION, Saitama (JP)

( * ) Notice: Subject to any disclaimer, the term of this patent is extended or adjusted under 35 U.S.C. 154(b) by 9 days.

(21) Appl. No.: 15/548,570

(22) PCT Filed: Jan. 28, 2016

(86) PCT No.: PCT/JP2016/052483
§ 371 (c)(1),
(2) Date: Aug. 3, 2017

(87) PCT Pub. No.: WO2016/125678
PCT Pub. Date: Aug. 11, 2016

(65) Prior Publication Data
US 2018/0011139 A1 Jan. 11, 2018

(30) Foreign Application Priority Data

Feb. 6, 2015 (JP) .................................. 2015-021721

(51) Int. Cl.
*G01R 31/00* (2006.01)
*G01R 31/28* (2006.01)
(Continued)

(52) U.S. Cl.
CPC ....... *G01R 31/2863* (2013.01); *G01R 1/0433* (2013.01); *H01R 12/73* (2013.01); *H05K 7/1007* (2013.01); *H01R 13/2435* (2013.01)

(58) Field of Classification Search
CPC ................ G01R 31/2628; G01R 31/28; G01R 31/2849; G01R 31/2887; G01R 31/2896;
(Continued)

(56) References Cited

U.S. PATENT DOCUMENTS

| 6,323,665 B1 | 11/2001 | Johnson et al. |
| 2004/0137767 A1* | 7/2004 | Suzuki ............... H01R 13/2421 439/73 |

(Continued)

FOREIGN PATENT DOCUMENTS

| JP | 2001-519535 | 10/2001 |
| JP | 2005-294017 | 10/2005 |

(Continued)

OTHER PUBLICATIONS

Written Opinion, PCT/ISA/237, dated Apr. 5, 2016, in corresponding International Patent Application No. PCT/JP2016/052483.

(Continued)

*Primary Examiner* — Thang X Le
(74) *Attorney, Agent, or Firm* — Staas & Halsey LLP

(57) ABSTRACT

To provide an electric component socket in which a pressing surface of a pressing member is prevented from contacting a contact pin when the socket is pressed by the pressing surface in a state where a first electric component is not housed in the socket.

A pressing surface of a pressing mechanism contacts a first electric component when the pressing mechanism is moved downward in a state where the first electric component is housed in a plate. On the other hand, when the pressing mechanism is moved downward in a state where the first electric component is not housed in the plate, a push-up member is lifted up with the plate to push up the pressing surface. Therefore, the pressing surface is moved upward to prevent the pressing surface from contacting the contact pin.

4 Claims, 11 Drawing Sheets

(51) Int. Cl.
  *G01R 1/04* (2006.01)
  *H01R 12/73* (2011.01)
  *H05K 7/10* (2006.01)
  *H01R 13/24* (2006.01)

(58) Field of Classification Search
  CPC ............ G01R 31/2886; G01R 31/0408; G01R 31/0483; G01R 31/0466; G01R 31/0433; G01R 31/2893; G01R 31/2851; G01R 1/07342; G01R 1/06711; G01R 1/06738; G01R 1/06772; G01R 31/31924; G01R 31/3004; G01R 31/2884; G01R 31/31922
  See application file for complete search history.

(56) References Cited

U.S. PATENT DOCUMENTS

2005/0231919 A1* 10/2005 Ujike ................... G01R 1/0458
                                                                    361/719
2009/0102497 A1* 4/2009 Ito ....................... G01R 31/2887
                                                                    324/757.01
2011/0298487 A1* 12/2011 Katsuma ............ G01R 31/2889
                                                                    324/756.07

FOREIGN PATENT DOCUMENTS

| JP | 2007-78576 | 3/2007 |
| JP | 2009-158362 | 7/2009 |

OTHER PUBLICATIONS

International Search Report, PCT/ISA/210, dated Apr. 5, 2016, in corresponding International Patent Application No. PCT/JP2016/052483.

* cited by examiner

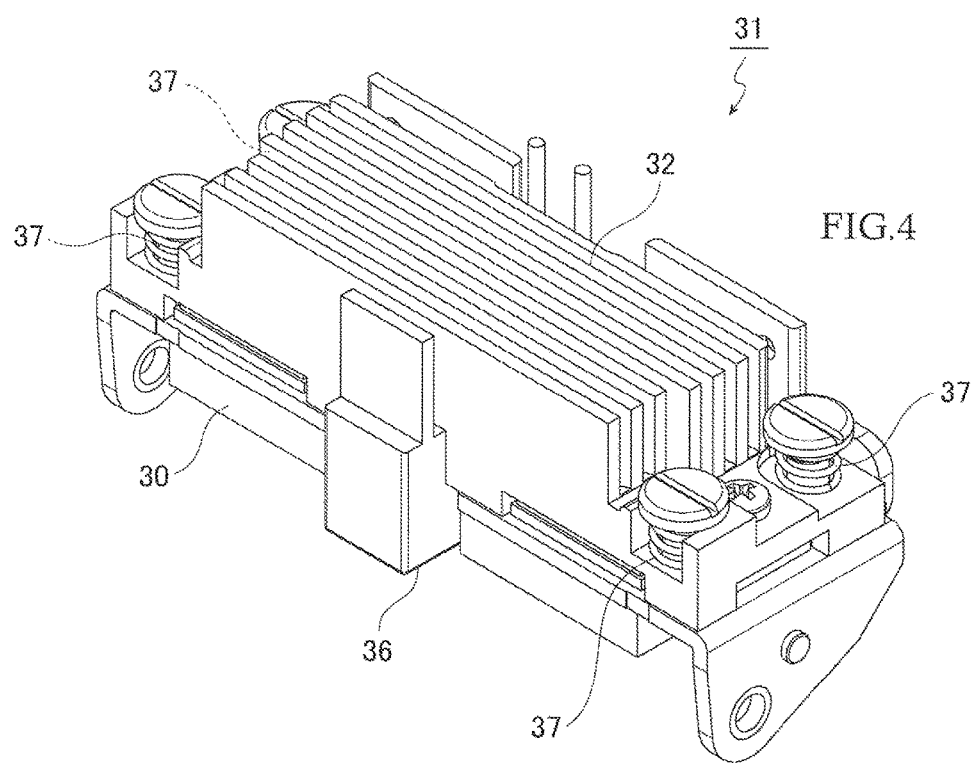

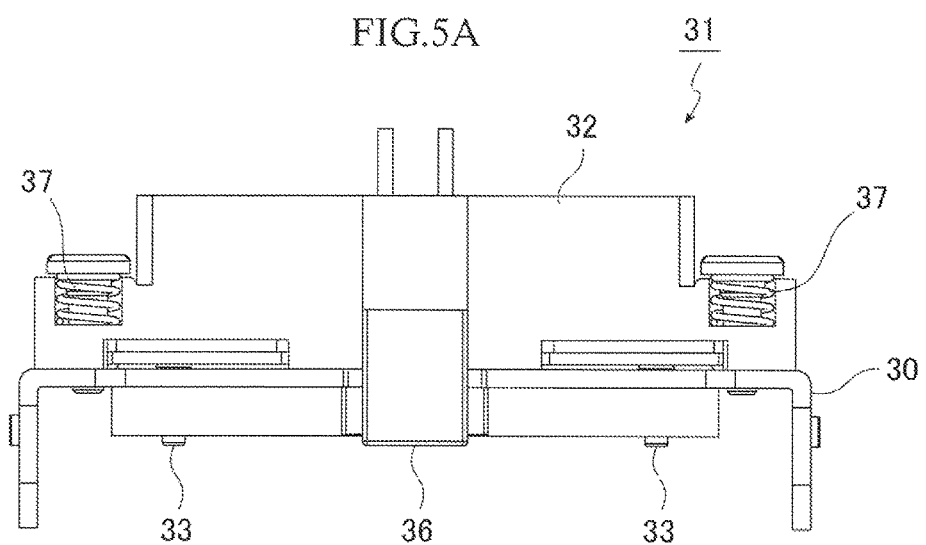

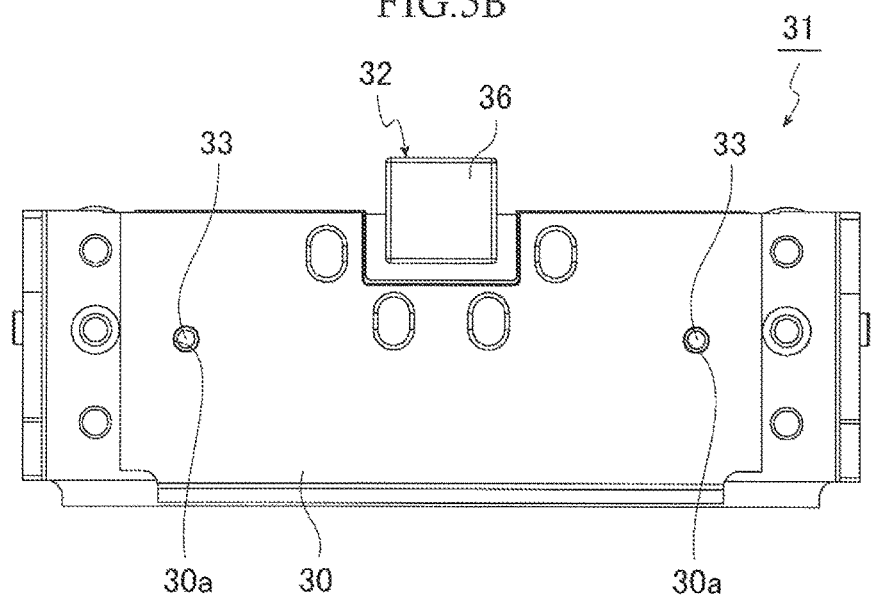

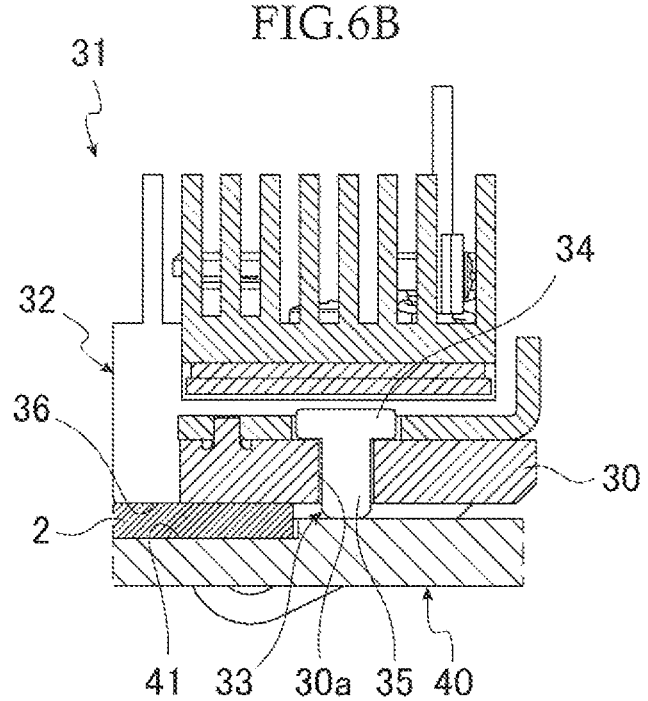

ary benefit under 35 U.S.C. § 119 of Japanese Patent Application No. 2015-021721, filed Feb. 6, 2015, the contents of which are incorporated herein by reference.

ELECTRIC COMPONENT SOCKET

CROSS-REFERENCE TO RELATED APPLICATIONS

This application is a U.S. National Stage application, which claims the benefit under 35 U.S.C. § 371 of International Patent Application No. PCT/JP2016/052483, filed Jan. 23, 2016, which claims the foreign priority benefit under 35 U.S.C. § 119 of Japanese Patent Application No. 2015-021721, filed Feb. 6, 2015, the contents of which are incorporated herein by reference.

TECHNICAL FIELD

The present invention relates to an electric component socket that is electrically connected to an electric component such as a semiconductor device (hereinafter referred to as "IC package").

BACKGROUND ART

Conventionally, among these types of electric component sockets, there is known an IC socket including a contact pin disposed in a socket body. This IC socket is adapted to be disposed on a wiring board and to house an IC package that is an object to be inspected. Terminals of this IC package are electrically connected with electrodes of the wiring board through the contact pin to perform tests such as a continuity test.

In such tests, a plurality of IC sockets are aligned, and each IC package is housed in the corresponding IC socket, so that a plurality of IC packages are simultaneously tested to improve the work efficiency (see Japanese Patent Laid-Open No. 2007-78576).

The IC package may be pressed by a pressing surface (a pedestal surface) of a heat sink for radiating heat of the IC package during the test.

When a plurality of the IC sockets are aligned and the IC packages are simultaneously tested as described above, this heat sink is provided to each of all the IC sockets.

SUMMARY OF INVENTION

Technical Problem

However, as in Japanese Patent Laid-Open No. 2007-78576 described above, when the plurality of IC packages are simultaneously tested using the plurality of IC sockets, there may be some IC sockets in which the IC packages are not housed depending on the number of IC packages to be tested. Even in a state where the IC packages are not housed in some IC sockets, all of the heat sinks operate in the same manner. Therefore, in the IC socket in which the IC package is not housed, the pressing surface of the heat sink directly contacts the contact pin which may cause the breakage of the contact pin or may cause a damage of the pressing surface. Furthermore, if the IC package is housed in a state where the contact pin or the pressing surface is thus damaged, the IC package may be damaged.

An object of the present invention is to provide an electric component socket in which a pressing surface of a heat sink is prevented from contacting a contact pin even when the socket is pressed by the pressing surface in a state where an electric component such as an IC package is not housed in the socket.

Solution to Problem

To solve the problems, an electric component socket according to the present invention includes: a socket body in which a first electric component is housed and which is disposed on a second electric component, the first electric component and the second electric component being electrically connected to each other via a contact pin disposed in the socket body; a plate which is provided in an upper part of the socket body and houses the first electric component; a pressing mechanism which is disposed above the socket body, and has a pressing surface which is moved downward to a socket body side to push down the first electric component housed in the plate so that the pressing surface is brought into contact with the contact pin; and a push-up member which prevents the pressing surface of the pressing mechanism from being moved downward when the first electric component is not housed in the plate so that the pressing surface is not brought into contact with the contact pin.

In the present invention, it is desirable that the push-up member is configured to prevent the pressing surface of the pressing mechanism to be moved downward when the pressing surface is moved downward below a position at which a top surface of the first electric component is positioned when the first electric component is housed in the plate.

In the present invention, it is desirable that the pressing mechanism includes: a cover member which is located above the plate; and a heat sink which is provided above the cover member to be relatively movable with respect to the cover member, the pressing surface is provided to the heat sink so as to protrude downward from the cover member, and the push-up mechanism pushes up the heat sink to prevent the pressing surface from being moved downward.

In the present invention, it is desirable that the push-up member includes: a flange part which is provided so as to be relatively movable with respect to the cover member, and is engaged with the cover member to prevent the push-up member from falling down; and a push-up member body which protrudes downward from a bottom surface of the cover member in a state where the push-up member is prevented from falling down by the flange part.

In the present invention, it is desirable that the cover member has a through-hole which penetrates vertically, the push-up member is supported to be relatively movable with respect to the cover member by inserting the push-up member body into the through-hole from above so that the flange part of the push-up member is disposed on an upper side of the cover member.

In the present invention, it is desirable that when the pressing mechanism is moved downward to the socket body side without housing the first electric component in the plate, the downward movement of the pressing mechanism enables the push-up member body of the push-up member to be lifted up with the plate so that the flange part is moved upward to push up the heat sink.

In the present invention, it is desirable that the plate is a floating plate which is supported on an upper part of the socket body in a vertically movable manner.

Advantageous Effects of Invention

According to the present invention, when the first electric component is not housed in the plate, the push-up member can prevent the pressing surface of the pressing mechanism from being moved downward and contacting the contact pin.

As a result, according to the present invention, an occurrence such as breakage of the contact pin, damage of the pressing surface, or breakage of the first electric component can be prevented.

In the present invention, the push-up member is configured to prevent the pressing surface of the pressing mechanism to be moved downward when the pressing surface reaches below the top surface position of the first electric component so that the pressing surface can be prevented to be moved downward only when the first electric component is not housed in the plate.

In the present invention, the pressing mechanism is provided with the cover member and the heat sink so that the push-up member can prevent the pressing surface of the heat sink from being moved downward and contacting the contact pin.

In the present invention, the push-up member having the flange and the push-up member body is used so that a configuration of the push-up member can be simplified.

In the present invention, the push-up member body is inserted into the through-hole in the cover member, and the flange is disposed above the through-hole so that the push-up member can be disposed in the cover member in a simple configuration.

In the present invention, the push-up member is configured to push up the heat sink by lifting up the push-up member body with the plate and moving the flange part upward, so that the pressing surface of the pressing mechanism can be prevented from being moved downward in a simple configuration.

In the present invention, the floating plate is used as the plate so that a contact pressure between the first electric component and the contact pin can be appropriately set.

BRIEF DESCRIPTION OF DRAWINGS

FIG. 4 is a perspective view illustrating a pressing mechanism of the electric component socket according to Embodiment 1 of the present invention.

FIG. 5A is an elevation view illustrating the pressing mechanism of the electric component socket according to Embodiment 1 of the present invention.

FIG. 5B is a bottom plan view illustrating the pressing mechanism of the electric component socket according to Embodiment 1 of the present invention.

FIG. 6B is a cross-sectional view illustrating a state after the push-up member is moved downward when the IC package is housed in the floating plate in the electric component socket according to Embodiment 1 of the present invention.

DESCRIPTION OF EMBODIMENTS

An embodiment of the present invention is described below.

[Embodiment 1 of Invention]

Embodiment 1 of the present invention is illustrated in FIG. 1 to FIG. 7B.

Figure 1:
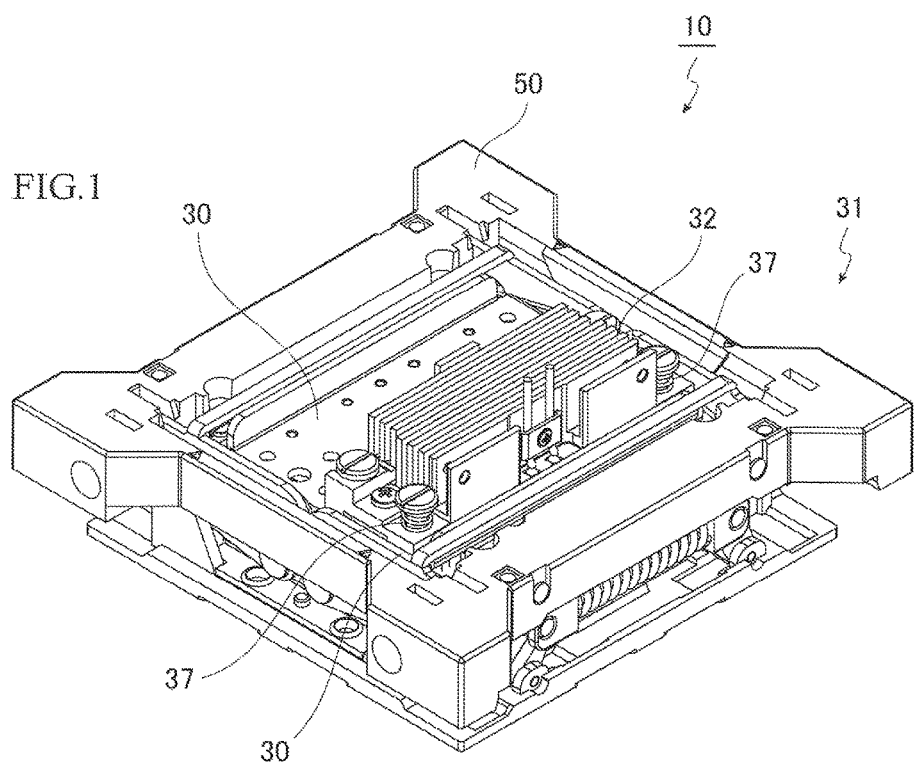
FIG. 1 is an external perspective view illustrating an electric component socket according to Embodiment 1 of the present invention.
Figure 2A:
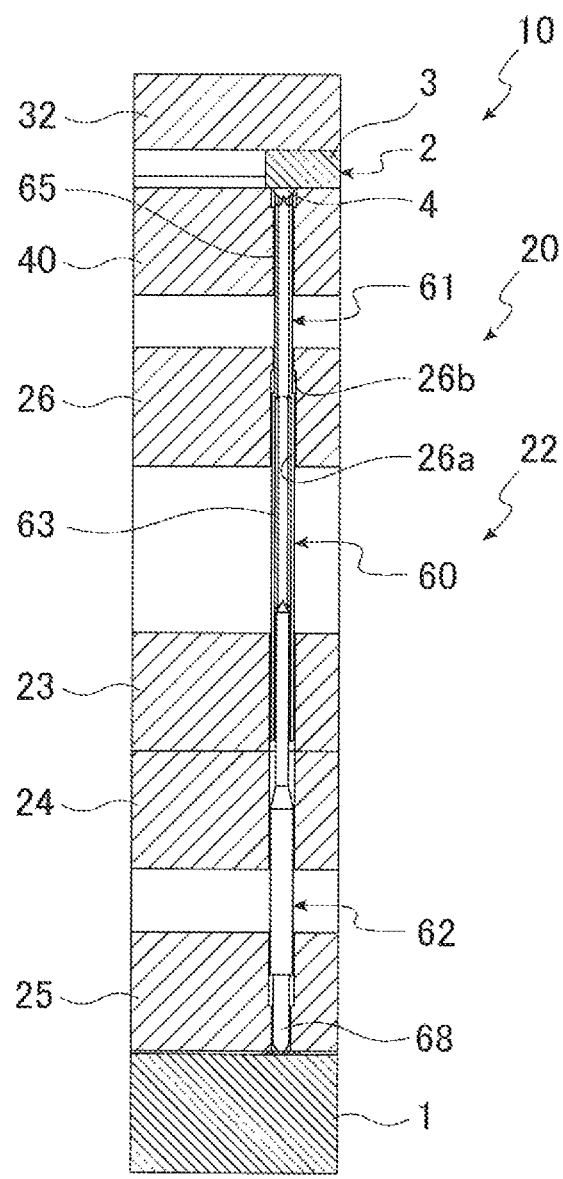
FIG. 2A is a cross-sectional view illustrating a main portion of the electric component socket according to Embodiment 1 of the present invention in which an IC package is housed in a floating plate.

As illustrated in FIG. 1 and FIG. 2A, an IC socket 10 as an "electric component socket" according to Embodiment 1 is disposed on a wiring board 1 as a "second electric component", and houses an IC package 2 as a "first electric component" on an upper surface of the IC socket 10 so that an electrode (not illustrated) of the wiring board 1 is electrically connected to a terminal 4 of the IC package 2. The IC socket 10 is used as a test apparatus for a continuity test such as a burn-in test for the IC package 2, for example.

As illustrated in FIG. 2A, the IC package 2 has a substantially square-shaped package body 3, and a plurality of hemispherical terminals 4 are disposed in a matrix form in a predetermined substantially square-shaped range on a bottom surface of the package body 3.

As illustrated in FIG. 1 and FIG. 2A, the IC socket 10 has a socket body 20 disposed on the wiring board 1, the socket body 20 being provided with a pressing mechanism 31 which is moved downward to the socket body 20 side to bring the IC package 2 into contact with a first contact part 65 of a contact pin 60 described later. This pressing mechanism 31 includes: a pair of cover members 30 configured to turn with respect to the socket body 20 through a link mechanism (not illustrated) and to be openably attached; a pair of heat sinks 32 provided to be relatively movable with respect to the cover members 30; and four coil springs 37 elastically energizing each heat sink 32 to each cover member 30 side, as illustrated in FIG. 4, FIG. 5A, and FIG. 5B. Note that one heat sink 32 of the pair of heat sinks 32 is not illustrated in FIG. 1.

As illustrated in FIG. 1, a flame-like operation member 50 is attached to the pressing mechanism 31. When the operation member 50 is appropriately operated, the pair of cover members 30 and the pair of heat sinks 32 can be turned to open or close.

Figure 6A:
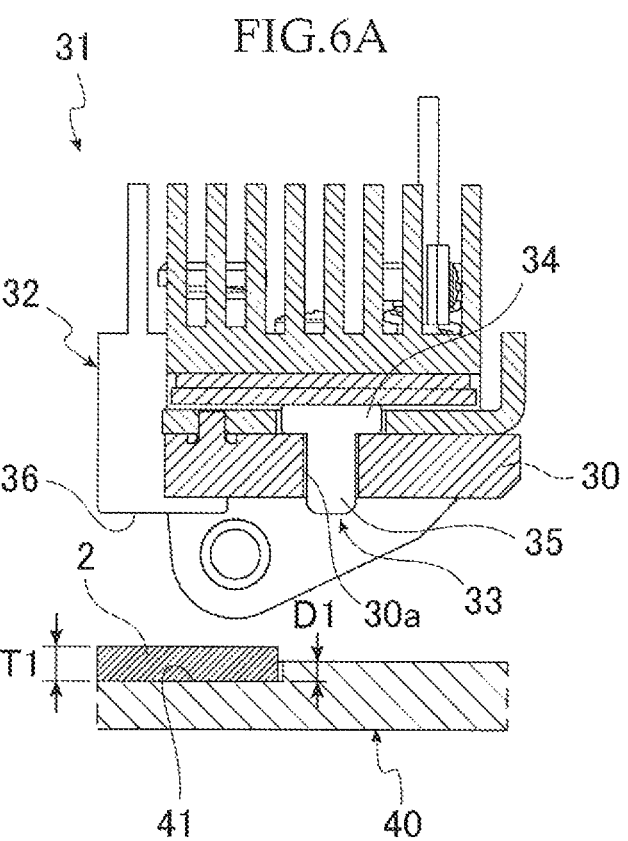
FIG. 6A is a cross-sectional view illustrating a state before a push-up member is moved downward when the IC package is housed in the floating plate in the electric component socket according to Embodiment 1 of the present invention.

As illustrated in FIG. 5B, FIG. 6A and the like, a pair of through-holes 30a are vertically formed in each cover member 30, and a stepped round rod-shaped push-up member 33 is loosely inserted into each through-hole 30a to be vertically relatively movable. Each of the push-up member 33 includes a flange part 34 which is engaged with the cover member 30 to prevent the push-up member 33 from falling down, and a push-up member body 35 which protrudes downward from a bottom surface of the cover member 30 in a state where the push-up member 33 is prevented from falling down by the flange part 34. When the pair of push-up members 33 are lifted up with a floating plate 40 described later, the push-up member bodies 35 of the push-up members 33 are moved upward so that the flange parts 34 push up the heat sink 32. Note that a pedestal surface 36 as a "pressing surface" is provided to the heat sink 32 to protrude downward, as illustrated in FIG. 4, FIG. 5A, and the like.

Figure 2B:
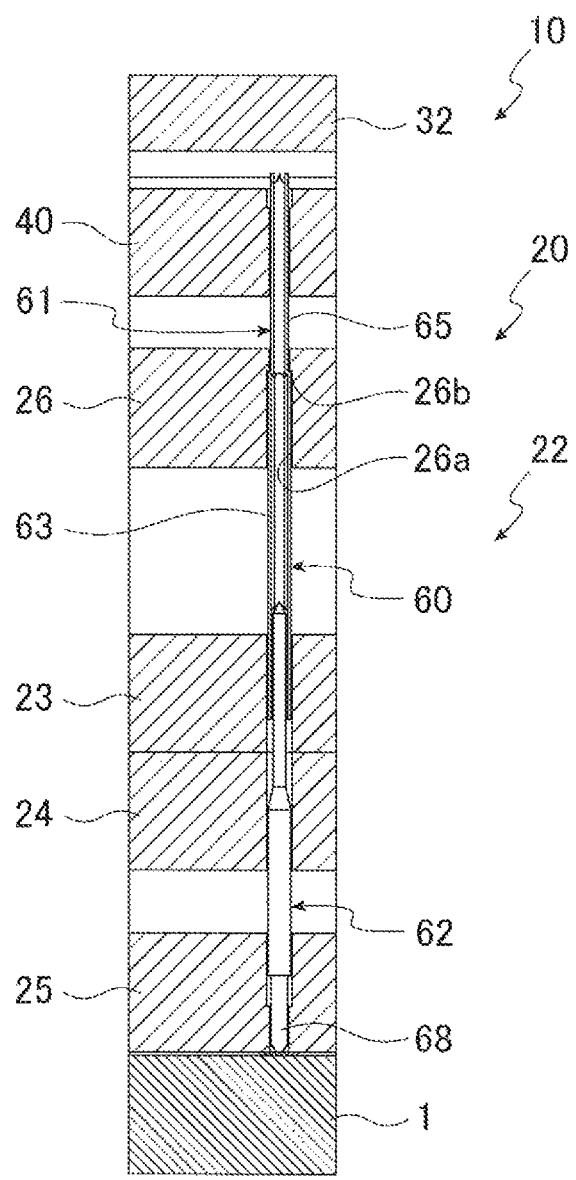
FIG. 2B is a cross-sectional view illustrating the main portion of the electric component socket according to Embodiment 1 of the present invention in which the IC package is not housed in the floating plate.

As illustrated in FIG. 2A and FIG. 2B, the socket body 20 includes a contact module 22 of a substantially rectangular shape in a plan view. This contact module 22 has a plurality of contact pins 60 disposed in a matrix form, and is adapted to house the IC package 2 on an upper surface side of the contact pins 60. However, in FIG. 2A and FIG. 2B, only one contact pin 60 is conveniently illustrated.

Figure 7A:
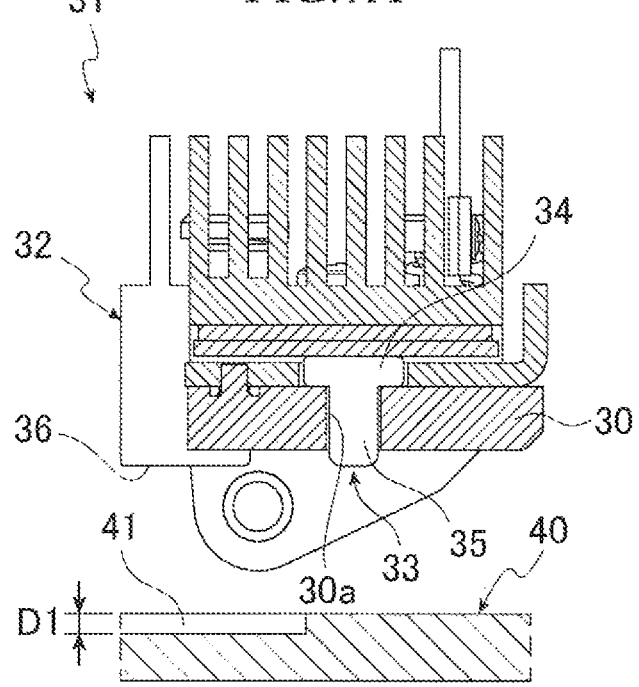
FIG. 7A is a cross-sectional view illustrating a state before the push-up member is moved downward when the IC package is not housed in the floating plate in the electric component socket according to Embodiment 1 of the present invention.
Figure 7B:
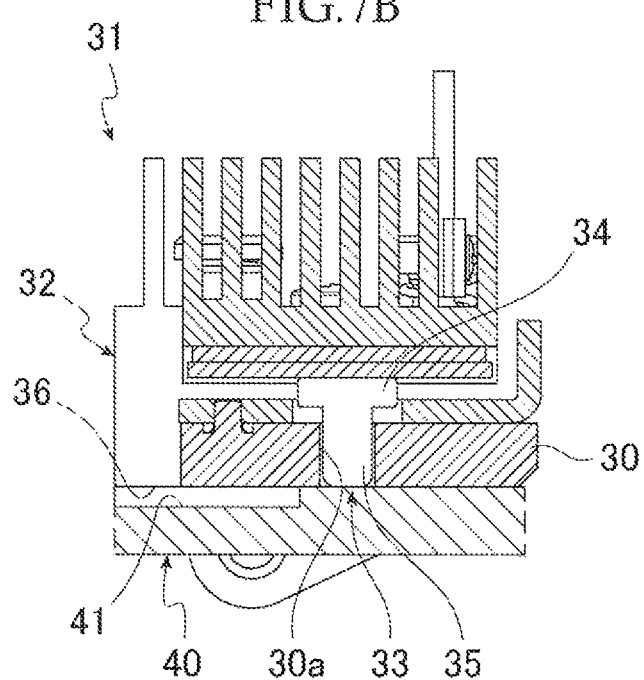
FIG. 7B is a cross-sectional view illustrating a state after the push-up member is moved downward when the IC package is not housed in the floating plate in the electric component socket according to Embodiment 1 of the present invention.

This contact module 22 includes an upper-side plate 26, a first center plate 23, a second center plate 24, a lower-side plate 25, and a floating plate 40, as illustrated in FIG. 2A and the like. The upper-side plate 26, the first center plate 23, the second center plate 24 and the lower-side plate 25 are fixed and held at a predetermined interval. The floating plate 40 is supported above the upper-side plate 26 in a vertically movable manner. This floating plate 40 is energized upward by springs (not illustrated), and a package housing recess part 41 of a substantially square shape is formed in an top surface of the floating plate 40, as illustrated in FIG. 7A and FIG. 7B. A depth D1 of this package housing recess part 41 is smaller than a thickness T1 of the IC package 2 (i.e. D1<T1), as illustrated in FIG. 6A and FIG. 6B.

Figure 3:
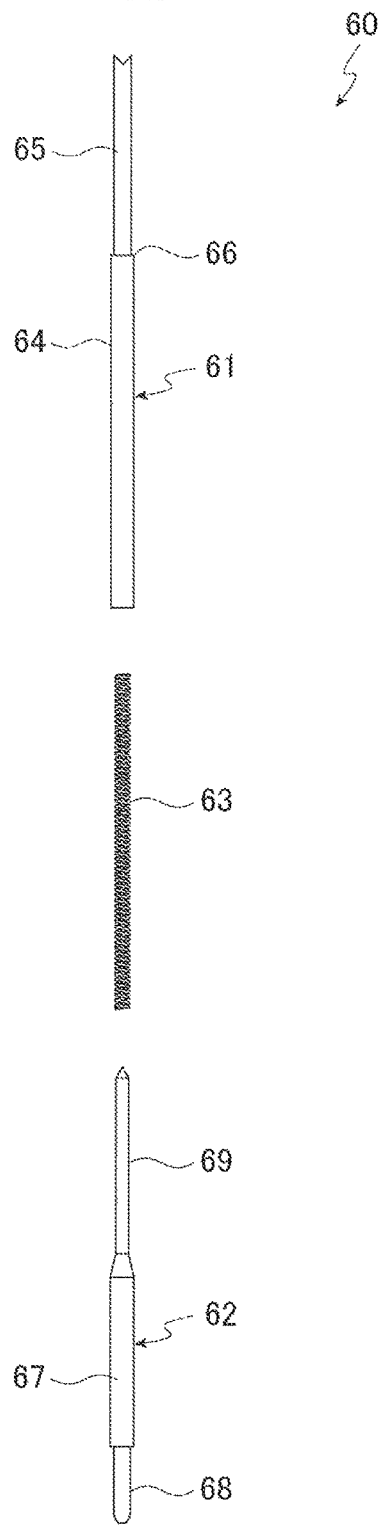
FIG. 3 is an exploded elevation view illustrating the contact pin of the electric component socket according to Embodiment 1 of the present invention.

The contact pin 60 includes a first cylindrical conductive plunger 61 with step, a second round rod-shaped conductive plunger 62 with step, and a coil spring 63, as illustrated in FIG. 3.

The first plunger 61 includes: an outer cylinder part 64 having an inner diameter larger than an outer diameter of the coil spring 63; a first contact part 65 having an inner diameter smaller than the outer diameter of the coil spring 63; and a stepped part 66 that is located between the outer cylinder part 64 and the first contact part 65, and the outer cylinder part 64, the first contact part 65, and the stepped part 66 being integrally connected. The stepped part 66 abuts against a step part 26*b* that is provided in the through-hole 26*a* in the upper-side plate 26, thereby regulating an upward movement of the first plunger 61, as illustrated in FIG. 2B and the like. The first contact part 65 of the first plunger 61 can be brought into contact with the terminal 4 of the IC package 2 by moving the floating plate 40 downward as described later (see FIG. 2A).

The second plunger 62 includes: a body part 67 having an outer diameter larger than the inner diameter of the outer cylinder part 64 of the first plunger 61; a second contact part 68 having an outer diameter smaller than the outer diameter of the body part 67; and an inner contact part 69 having an outer diameter smaller than the inner diameter of the outer cylinder part 64 of the first plunger 61, and the body part 67, the second contact part 68, and the inner contact part 69 being integrally connected. The inner contact part 69 is inserted into the outer cylinder part 64 of the first plunger 61 in a vertically movable manner. The inner contact part 69 is formed in a tapered shape having a diameter enlarged from an upper end (one end on the first plunger 61 side) toward a lower end (the other end on the body part 67 side), that is a diameter at the lower end is larger than a diameter at the upper end. The inner contact part 69 is configured to be brought into contact with an inner surface of the outer cylinder part 64 for conduction. When the wiring board 1 is disposed at a predetermined position of the lower surface of the socket body 20, the second contact part 68 of the second plunger 62 is brought into contact with the electrode of the wiring board 1.

The coil spring 63 is inserted into the outer cylinder part 64 of the first plunger 61, and provided in a contracted state in which the upper end thereof contacts the stepped part 66 of the first plunger 61, and the lower end thereof contacts one end of the inner contact part 69 of the second plunger 62. The first plunger 61 and the second plunger 62 are energized in a mutually separating direction (a vertical direction).

The operations of the IC socket 10 having such a configuration are described with reference to FIG. 2A, FIG. 2B, FIG. 6A, FIG. 6B, FIG. 7A, FIG. 7B and the like.

Before a continuity test such as a burn-in test for the IC package 2 is performed, the operation member 50 (see FIG. 1) is operated to open the pair of cover members 30. In this state, the IC package 2 is housed in the package housing recess part 41 of the floating plate 40. Then, the operation member 50 is operated to close the pair of the cover members 30. As a result, the pedestal surface 36 of the heat sink 32 is located above the IC package 2, as illustrated in FIG. 6A. The operation member 50 is further operated to move the pair of cover members 30 and the pair of heat sinks 32 downward. As illustrated in FIG. 6B, the pedestal surface 36 of the heat sink 32 contacts a top surface of the IC package 2, the IC package 2 is moved downward by a pressing force of the heat sink 32, and the floating plate 40 is also moved downward. Then, the terminal 4 of the IC package 2 contacts the first contact part 65 of the contact pin 60.

The operation member 50 is operated to further move the pair of cover members 30 and the pair of heat sinks 32 downward. The first contact part 65 of the contact pin 60 is pushed down by the terminal 4 of the IC package 2, and moved downward against biasing force of the coil spring 63, as illustrated in FIG. 2A. As a result, in the contact pin 60, the first contact part 65 of the first plunger 61 contacts the terminal 4 of the IC package 2 with a predetermined contact pressure, and the second contact part 68 of the second plunger 62 contacts the electrode of the wiring board 1 with the predetermined contact pressure.

In this state, the continuity test for the IC package 2 is performed.

On the other hand, when the cover member 30 is closed without housing the IC package 2 in the package housing recess part 41 of the floating plate 40, the pedestal surface 36 of the heat sink 32 is located above the package housing recess part 41 of the floating plate 40, as illustrated in FIG. 7A. When the pair of cover members 30 and the pair of heat sinks 32 are further moved downward, bottom surfaces of the pair of cover members 30 contact the top surface of the floating plate 40, and the pair of push-up members 33 are lifted up with the floating plate 40 to push up the heat sink 32 to the highest position, as illustrated in FIG. 7B. As a result, the pedestal surface 36 of the heat sink 32 separates upward from the package housing recess part 41 of the floating plate 40.

Accordingly, the pedestal surface 36 of the heat sink 32 can be prevented from contacting the first contact part 65 of the contact pin 60. As a result, an occurrence such as the breakage of the contact pin 60 or the damage of the pedestal surface 36 can be prevented. Therefore, even if the IC package 2 is housed in the package housing recess part 41 in the next continuity test, breakage of the IC package 2 is not caused by the breakage of the contact pin 60 or the damage of the pedestal surface 36.

As described above, when the pair of push-up members 33 are lifted up with the floating plate 40, the push-up member bodies 35 of the push-up members 33 are moved upward so that the flange parts 34 push up the heat sink 32.

Thus, the above-described push-up member 33 can perform the push-up operation smoothly.

Embodiment 1 described above is described in a case where the stepped round rod-shaped push-up member 33 is loosely inserted into the through-hole 30a of the cover member 30. However, the shape and attachment position of the push-up member 33 are not particularly limited to the above-described shape and attachment position as long as when the pressing mechanism 31 is moved downward to the socket body 20 side without housing the IC package 2 in the floating plate 40, the heat sink 32 is pushed up by the downward movement of the pressing mechanism 31, thereby enabling the heat sink 32 to be moved upward with respect to the cover member 30 to prevent the pedestal surface 36 from contacting the first plunger 61 of the contact pin 60. A substantially round rod-shaped push-up member may be provided on the bottom surface of the heat sink 32, or a substantially cylindrical push-up member may be provided on the top surface of the floating plate 40, for example.

In Embodiment 1 described above, the IC socket 10 in which the floating plate 40 is provided to the socket body 20 is described, but the present invention can be similarly to the IC socket 10 without the floating plate 40.

REFERENCE SIGNS LIST

1 wiring board (second electric component)
2 IC package (first electric component)
3 package body
4 terminal
10 IC socket (electric component socket)
20 socket body
30 cover member
31 pressing mechanism
32 heat sink
33 push-up member
34 flange part
35 push-up member body
36 pedestal surface (pressing surface)
40 floating plate (plate)
50 operation member
60 contact pin

The invention claimed is:

1. An electric component socket comprising:
   a socket body in which a first electric component is housed and which is disposed on a second electric component, the first electric component and the second electric component being electrically connected to each other via a contact pin disposed in the socket body;
   a plate which is provided in an upper part of the socket body and houses the first electric component;
   a pressing mechanism which is disposed above the socket body, and has a pressing surface which is moved downward to a socket body side to push down the first electric component housed in the plate so that the first electric component is brought into contact with the contact pin; and
   a push-up member which prevents the pressing surface of the pressing mechanism from being moved downward when the first electric component is not housed in the plate so that the pressing surface is not brought into contact with the contact pin, wherein:
      the pressing mechanism includes a cover member which is located above the plate and a heat sink which is provided above the cover member to be relatively movable with respect to the cover member,
      the pressing surface is provided to the heat sink so as to protrude downward from the cover member, and
      the push-up member pushes up the heat sink to prevent the pressing surface from being moved downward.

2. The electric component socket according to claim 1, wherein
   the push-up member includes:
      a flange part which is provided so as to be relatively movable with respect to the cover member, and is engaged with the cover member to prevent the push-up member from falling down; and
      a push-up member body which protrudes downward from a bottom surface of the cover member in a state where the push-up member is prevented from falling down by the flange part.

3. The electric component socket according to claim 2, wherein
   the cover member has a through-hole which penetrates vertically, and
   the push-up member is supported to be relatively movable with respect to the cover member by inserting the push-up member body into the through-hole from above so that the flange part of the push-up member is disposed on an upper side of the cover member.

4. The electric component socket according to claim 3, wherein
   when the pressing mechanism is moved downward to the socket body side without housing the first electric component in the plate, the downward movement of the pressing mechanism enables the push-up member body of the push-up member to be lifted up with the plate so that the flange part is moved upward to push up the heat sink.

* * * * *